(12) United States Patent
Fukazawa et al.

(10) Patent No.: US 10,186,585 B2
(45) Date of Patent: Jan. 22, 2019

(54) SEMICONDUCTOR DEVICE AND METHOD FOR MANUFACTURING THE SAME

(71) Applicant: AIR WATER INC., Sapporo-shi, Hokkaido (JP)

(72) Inventors: Akira Fukazawa, Nagano (JP); Sumito Ouchi, Nagano (JP)

(73) Assignee: Air Water Inc. (JP)

(*) Notice: Subject to any disclaimer, the term of this patent is extended or adjusted under 35 U.S.C. 154(b) by 0 days.

(21) Appl. No.: 15/521,697

(22) PCT Filed: Aug. 12, 2015

(86) PCT No.: PCT/JP2015/072863
§ 371 (c)(1),
(2) Date: Apr. 25, 2017

(87) PCT Pub. No.: WO2016/072122
PCT Pub. Date: May 12, 2016

(65) Prior Publication Data
US 2017/0236907 A1    Aug. 17, 2017

(30) Foreign Application Priority Data

Nov. 4, 2014    (JP) .................................. 2014-224076

(51) Int. Cl.
*H01L 29/872* (2006.01)
*H01L 21/205* (2006.01)
(Continued)

(52) U.S. Cl.
CPC ...... *H01L 29/267* (2013.01); *H01L 21/02502* (2013.01); *H01L 21/02598* (2013.01);
(Continued)

(58) Field of Classification Search
CPC ......... H01L 29/66143; H01L 29/66212; H01L 29/66219; H01L 29/872; H01L 21/02381;
(Continued)

(56) References Cited

U.S. PATENT DOCUMENTS

| 2006/0138448 A1* | 6/2006 | Komiyama | ....... H01L 21/02381 257/103 |
| 2012/0074424 A1* | 3/2012 | Lee | ..................... H01L 21/2007 257/76 |

FOREIGN PATENT DOCUMENTS

| EP | 1 947 700 A2 | 7/2008 |
| JP | 2003-060234 A | 2/2003 |

(Continued)

OTHER PUBLICATIONS

International Search Report, dated Oct. 6, 2015, in International Application No. PCT/JP2015/072863.
(Continued)

*Primary Examiner* — Robert Bachner
*Assistant Examiner* — Molly Reida
(74) *Attorney, Agent, or Firm* — Wood, Phillips, Katz, Clark & Mortimer (57) ABSTRACT

A semiconductor device which can reduce power consumption and a method for manufacturing the same are provided. A semiconductor device comprises an Si (silicon) substrate, an SiC (silicon carbide) layer formed on the surface of the Si substrate, an AlN (aluminum nitride) layer formed on the surface of the SiC layer, an n-type GaN (gallium nitride) layer formed on the surface of the AlN layer, a first electrode formed at the surface side of the GaN layer, and a second electrode formed at the reverse face side of the Si substrate 1. The magnitude of electrical current which flows between
(Continued)

the first electrode and the second electrode depends on electrical voltage between the first electrode and the second electrode.

9 Claims, 6 Drawing Sheets

(51) Int. Cl.
    *H01L 29/267*     (2006.01)
    *H01L 29/66*     (2006.01)
    *H01L 21/02*     (2006.01)
    *H01L 29/16*     (2006.01)
    *H01L 29/20*     (2006.01)
    *H01L 29/207*     (2006.01)

(52) U.S. Cl.
    CPC ...... *H01L 29/66212* (2013.01); *H01L 29/872* (2013.01); *H01L 21/0254* (2013.01); *H01L 21/0262* (2013.01); *H01L 21/02381* (2013.01); *H01L 21/02447* (2013.01); *H01L 21/02458* (2013.01); *H01L 21/02505* (2013.01); *H01L 29/1608* (2013.01); *H01L 29/2003* (2013.01); *H01L 29/207* (2013.01)

(58) Field of Classification Search
    CPC ......... H01L 21/02447; H01L 21/02458; H01L 21/02378; H01L 21/0254
    USPC ........ 257/471, 472, 473, 485, 486, E29.338, 257/E21.359, E21.368
    See application file for complete search history.

(56) References Cited

FOREIGN PATENT DOCUMENTS

| | | |
|---|---|---|
| JP | 2007-36010 A | 2/2007 |
| JP | 2007-036010 A | 2/2007 |
| JP | 2007-036010 A | 2/2007 |
| JP | 2009-81269 A | 4/2009 |
| JP | 2009-081269 A | 4/2009 |
| JP | 2009-081269 A | 4/2009 |
| JP | 2013-179121 A | 9/2013 |
| JP | 2013-179121 A | 9/2013 |
| JP | 2014-76925 A | 5/2014 |
| JP | 2014-076925 A | 5/2014 |
| JP | 2014-076925 A | 5/2014 |

OTHER PUBLICATIONS

International Preliminary Report on Patentability, dated May 9, 2017, in International Application No. PCT/JP2015/072863.
Notification of Reasons for Refusal, dated Jul. 25, 2017, in Japanese Patent Application No. 2014-224076.
Komiyama Jun et al, "Suppression of crack generation in GaN epitaxy on Si using cubic Sic as intermediate layers", Applied Physics Letters, Feb. 27, 2006, vol. 88, No. 9, A I P Publishing LLC, US.
Extended European Search Report, dated May 24, 2018, in European Patent Application No. 15856987.1.

* cited by examiner

SEMICONDUCTOR DEVICE AND METHOD FOR MANUFACTURING THE SAME

FIELD OF THE INVENTION

This invention relates to a semiconductor device and a method for manufacturing the same. More specifically, this invention relates to a semiconductor device including an SiC (silicon carbide) layer and a method for manufacturing the same.

DESCRIPTION OF THE RELATED ART

SiC has a wide band gap when compared to Si (silicon), and has high insulated breakdown field strength. Therefore, SiC is expected to serve as material of high-voltage semiconductor devices. Since the lattice constant of 3C-SiC (SiC which has a 3C type crystal structure) is similar to the lattice constant of GaN (gallium nitride), 3C-SiC can be used as a buffer layer for growing GaN. Since the insulated breakdown field strength of GaN is higher than the insulated breakdown field strength of SiC, higher-voltage semiconductor devices of GaN can be obtained by adopting 3C-SiC as a buffer layer.

As a foundation substrate for growing an SiC layer, Si substrates, or bulk SiC substrates are widely used. Since there are only about 4 inch SiC substrates at present, it is difficult to increase the diameter. To obtain an inexpensive and large diameter SiC layer, it is preferable that an Si substrate is used as the foundation substrate.

A conventional semiconductor device which includes GaN is disclosed in the Document 1 below, for example. The Document 1 below discloses a semiconductor device comprising a Si substrate, a buffer layer formed on the Si substrate, an n-type semiconductor layer which consists of GaN formed on the buffer layer, an active layer which consists of lnGaN (indium gallium nitride) formed on the n-type semiconductor layer, a p-type semiconductor layer which consists of GaN formed on the active layer, an anode electrode formed on the p-type semiconductor layer, and a cathode electrode formed on the Si substrate. In the buffer layer, first layers which consist of AlN (aluminum nitride) and second layers which consist of GaN are alternately stacked.

The Documents 2 and 3 below disclose a method for forming a GaN layer on a SiC layer. The Document 2 discloses a method for manufacturing a semiconductor substrate comprising a first step for forming a film of $Al_xIn_yGa_{1-x-y}N$ ($0<x\le1$, $0\le y\le1$, $x+y\le1$) layer on SiC under a temperature higher than the temperature of forming a GaN film and after that forming a film of GaN under the temperature of forming a GaN film, and a second step for forming a film of an $Al_xIn_yGa_{1-x-y}N$ ($0<x\le1$, $0\le y\le1$, $x+y\le1$) layer under a temperature lower than the temperature of forming the GaN film and after that forming a film of GaN under the temperature of forming the GaN film.

The Document 3 discloses a method for manufacturing a semiconductor substrate comprising a step for preparing an Si substrate on which a SiC single-crystal thin film of which the film thickness is more than or equal to 2 nm and equal to or less than 3.5 μm was formed on the surface, and forming a buffer layer composed of at least 2 components among Al, In, Ga, and N by heating the Si substrate on which the SiC single-crystal thin film was formed to a predetermined growth temperature, a step for forming three-dimensional nuclei of GaN crystals on the buffer layer under a temperature lower than the growth temperature of the buffer layer, so that the nuclei have a predetermined density, and a step for growing the three-dimensional nuclei of the GaN crystals in a horizontal direction at a temperature lower than the growth temperature of the buffer layer so that a continuous GaN single-crystal film is formed. The film thickness of the buffer layer is less than 15 nm, and the composition is $Al_xIn_yGa_{1-x-y}N$ ($0.05\le x\le1$, $0\le y\le0.05$, $x+y\le1$).

PRIOR ART DOCUMENT(S)

Patent Document(s)

[Patent Document 1]: Japan Patent Publication No. 2003-60234

[Patent Document 2]: Japan Patent Publication No. 2013-179121

[Patent Document 3]: Japan Patent Publication No. 2014-76925

THE OVERVIEW OF THE INVENTION

Problems to be Resolved by the Invention

When producing a semiconductor device which includes an upright device by using a GaN layer, the conventional technique has a problem of high electrical resistance in the longitudinal direction (in a direction perpendicular to the substrate surface) and large power consumption.

This invention is to solve the above problems, and the object is to provide a semiconductor device and a method for manufacturing the same which can reduce the power consumption.

SUMMARY OF THE INVENTION

According to one aspect of this invention, a semiconductor device comprises: an electrical conductor layer, an SiC layer formed on a surface of the electrical conductor layer, an $Al_xGa_{1-x}N$ ($0<x\le1$) layer formed on a surface of the SiC layer, an $Al_yGa_{1-y}N$ ($0\le y<1$, $y<x$) layer of a first conductivity type, formed on a surface of the $Al_xGa_{1-x}N$ layer, a first electrode formed at a surface side of the $Al_yGa_{1-y}N$ layer, and a second electrode formed on a reverse face side of the electrical conductor layer, wherein magnitude of electrical current which flows between the first electrode and the second electrode depends on electrical voltage between the first electrode and the second electrode.

Preferably, the above mentioned semiconductor device further comprises a composite layer formed on a surface of the $Al_yGa_{1-y}N$ layer, wherein the composite layer includes an $Al_mGa_{1-m}N$ ($0<m\le1$, $y<m$) layer, and an $Al_nGa_{1-n}N$ ($0\le n<1$, $n<m$) layer formed on a surface of the $Al_mGa_{1-m}N$ layer, and the first electrode is formed at a surface side rather than the $Al_nGa_{1-n}N$ layer farthest from the electrical conductor layer.

Preferably, in the above mentioned semiconductor device, each of the $Al_yGa_{1-y}N$ layer and the $Al_nGa_{1-n}N$ layer has n-type conductivity, and each of the $Al_yGa_{1-y}N$ layer and the $Al_nGa_{1-n}N$ layer is doped with Si.

Preferably, in the above mentioned semiconductor device, thickness of each of the $Al_yGa_{1-y}N$ layer and the $Al_nGa_{1-n}N$ layer is more than or equal to 50 nm and equal to or less than 5 μm.

Preferably, in the above mentioned semiconductor device, thickness of each of the $Al_xGa_{1-x}N$ layer and the $Al_mGa_{1-m}N$ layer is more than 0 and equal to or less than 15 nm.

Preferably, in the above mentioned semiconductor device, the composite layer comprises of more than or equal to 1 and equal to or less than 4 layers.

Preferably, in the above mentioned semiconductor device, the electrical conductor layer is a Si substrate.

According to an other aspect of this invention, a method for manufacturing a semiconductor device comprises a step for preparing a substrate which includes an electrical conductor layer and an SiC layer formed on a surface of the electrical conductor layer, a step for forming a film of an $Al_xGa_{1-x}N$ ($0<x\le1$) layer on a surface of the SiC layer, a step for forming a film of $Al_yGa_{1-y}N$ layer ($0\le y<1$, $y<x$) of a first conductivity type on a surface of the $Al_xGa_{1-x}N$ layer, a step for forming a film of $Al_mGa_{1-m}N$ ($0<m\le1$, $y<m$) layer on a surface of the $Al_yGa_{1-y}N$ layer at a temperature lower than a film forming temperature of the $Al_yGa_{1-y}N$ layer, a step for forming a film of $Al_nGa_{1-n}N$ layer ($0\le n<1$, $n<x$, $n<m$) layer on a surface of the $Al_mGa_{1-m}N$ layer at a temperature higher than a film forming temperature of the $Al_mGa_{1-m}N$ layer, a step for forming a first electrode at a surface side of the $Al_nGa_{1-n}N$ layer, and a step for forming a second electrode at a reverse face side of the $Al_nGa_{1-n}N$ layer, wherein magnitude of electrical current which flows between the first electrode and the second electrode depends on electrical voltage between the first electrode and the second electrode.

Preferably, in the above mentioned method for manufacturing, the forming film of the $Al_yGa_{1-y}N$ layer is doped with Si, in the step for forming a film of the $Al_yGa_{1-y}N$ layer.

Preferably, in the above mentioned method for manufacturing, the forming film of the $Al_nGa_{1-n}N$ layer is doped with Si, in the step for forming a film of the $Al_nGa_{1-n}N$ layer.

Preferably, the above mentioned method for manufacturing further comprises a step for removing the electrical conductor layer after films of the $Al_xGa_{1-x}N$ layer, the $Al_yGa_{1-y}N$ layer, the $Al_mGa_{1-m}N$ layer, and the $Al_nGa_{1-n}N$ layer were formed, wherein the second electrode is formed at a reverse face side of the $Al_nGa_{1-n}N$ layer, in the step for forming the second electrode, after the electrical conductor layer was removed.

Preferably, in the above mentioned method for manufacturing, the substrate is removed in the step for removing the electrical conductor layer, Preferably, in the above mentioned method for manufacturing, all layers formed at a reverse face side of the $Al_nGa_{1-n}N$ layer are removed, maintaining the $Al_nGa_{1-n}N$ layer farthest from the substrate, in the step for removing the electrical conductor layer.

The Effect of the Invention

According to this this invention, a semiconductor device and a method for manufacturing the same which can reduce the power consumption can be provided.

DESCRIPTION OF THE PREFERRED EMBODIMENTS

The embodiments of this invention will be explained in the followings based on the Figures. In the following explanations, a "surface" of each of layers which constitute a semiconductor device is a term to represent an upper side face in Figures, and a "reverse face" is a term to represent a lower side face in Figures. The term of "being formed on a surface" means being formed making contact with the surface, and the term of "being formed on a reverse face" means being formed making contact with the reverse face. The term of a "surface side" encompasses a location making contact with the "surface" and an upper location in Figures being separated from the "surface". The term of a "reverse face side" encompasses a location making contact with the "reverse face" and a lower location in Figures being separated from the "reverse face".

[The First Embodiment]

Figure 1:
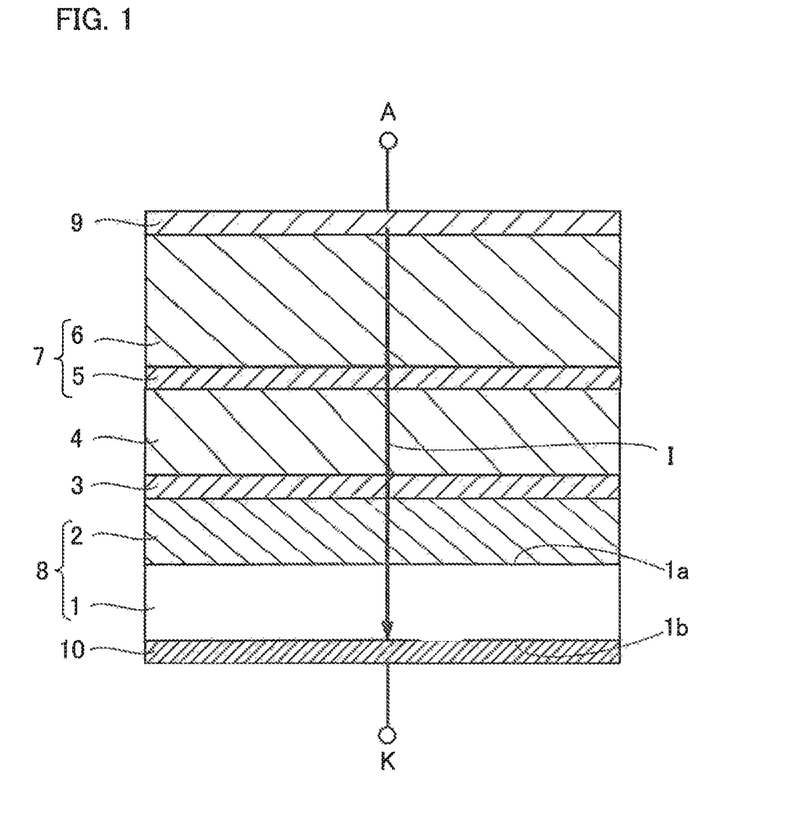
FIG. 1 shows a cross sectional view indicating a structure of the semiconductor device according to the first embodiment of this invention.

FIG. 1 shows a cross sectional view indicating a structure of the semiconductor device according to the first embodiment of this invention.

Referring to FIG. 1, the semiconductor device according to this embodiment includes a schottky barrier diode. The semiconductor device is equipped with Si substrate 1, SiC layer 2, AlN layer 3, GaN layer 4, AlN layer 5, GaN layer 6, and electrodes 9 and 10.

Si substrate 1 (an example of an electrical conductor layer) comprises of n-type Si. Si substrate 1 has surface 1a and reverse face 1b. The surface 1a of Si substrate 1 consists of a (111) plane of a Si crystal.

SiC layer 2 is formed on surface 1a of Si substrate 1. SiC layer 2 comprises of, for example, 3C-SiC, 4H-SiC, 6H-SiC, or the like. In particular, when SiC layer 2 was grown epitaxially on Si substrate 1, SiC layer 2 is typically formed by 3C-SiC. The thickness of SiC layer 2 is, for example, more than or equal to 2 nm and equal to or less than 3.5 μm.

SiC layer 2 may be formed by homoepitaxial growth of SiC by using the MBE (molecular beam epitaxy) method, the CVD (chemical vapor deposition) method, the LPE (liquid-phase epitaxy) method, or the like, on a foundation layer comprised of SiC which was made by carbonizing the surface of Si substrate 1. SiC layer 2 may be formed by only carbonizing the surface of Si substrate 1. SiC layer 2 may be formed by heteroepitaxial growth of SiC on the surface of Si substrate 1 interposing a buffer layer.

AlN layer (HT (High Temperature)-AlN layer) 3 is formed on the surface of SiC layer 2, AlN layer 3 has a function as a buffer layer which alleviates a gap between the lattice constant of SiC layer 2 and the lattice constant of GaN layer 4. AlN layer 3 is formed by using the MOCVD (Metal Organic Chemical Vapor Deposition) method, for example. The growth temperature of AlN layer 3 is more than or equal to 1100 degree Celsius and is equal to or less than 1300 degree Celsius, for example. The film forming temperature of AlN layer 3 is arbitrary, and may be the same level of the film forming temperature of GaN layer 4 which will be explained later. However, the film forming temperature of AlN layer 3 is preferably higher than the film forming temperature of GaN layer 4 which will be explained later. The growth temperature of AlN layer 3 is more than or equal to 1100 degree Celsius and is equal to or less than 1300 degree Celsius, for example. At this time, TMA(Tri Methyl Aluminium), TEA (Tri Ethyl Aluminium), or the like is used as Al source gas, for example. As N source gas, $NH_3$ (ammonia) is used, for example. The thickness of AlN layer 3 is preferably larger than 0 and equal to or less than 15 nm, Herewith, dislocation formed in AlN layer 3 can be reduced, and crystallinity of GaN layer 4 can be improved. In addition, time required for forming AlN layer 3 can shorten.

AlN layer 3 may be an $Al_xGa_{1-x}N$ (0<x≤1) layer, by replacing part of Al atoms with Ga atoms. However, to maintain crystallinity of GaN layer 4, the $Al_xGa_{1-x}N$ layer is preferably AlN (in which Al atoms do not replaced with Ga atoms).

GaN layer 4 is formed on the surface of AlN layer 3. GaN layer 4 is doped with Si, and the conductivity type is n-type. The thickness of GaN layer 4 is preferably more than or equal to 50 nm and equal to or less than 5 μm. The thickness of GaN layer 4 is more preferably more than or equal to 200 nm and equal to or less than 2 μm. Herewith, warpage of the substrate can be inhibited, and a high quality GaN layer can be obtained.

GaN layer 4 is formed by using the MOCVD method in the following manner, for example. Firstly, three-dimensional nuclei of GaN crystal are formed at predetermined density. Next, the three-dimensional nuclei of GaN crystal are grown in the horizontal direction at a temperature lower than the growth temperature of AlN layer 3 to form a continuous GaN single-crystal film. At this time, as Ga source gas, TMG (Tri Methyl Gallium), TEG (Tri Ethyl Gallium), or the like is used, for example. As N source gas, $NH_3$ is used, for example. As Si source gas, for example, $SiH_4$ (silane) is used. As such the method, by doping the forming film of GaN layer 4 with Si, n-type GaN layer 4 can be made simply.

The process temperature (the film forming temperature of GaN layer 4) in the step for forming the three-dimensional nuclei, and the step for growing the three-dimensional nuclei of GaN crystals in the horizontal direction is more than or equal to 900 degree Celsius and equal to or less than 1200 degree Celsius, for example.

GaN layer 4 may be $Al_yGa_{1-y}N$ layer (0≤y<1, y<x, preferably y≤0.2, more preferably y≤0.1) by replacing part of Ga atoms with Al atoms. However, to maintain crystallinity of GaN layer 4, the $Al_yGa_{1-y}N$ layer is preferably GaN (in which Ga atoms do not replaced with Al atoms).

AlN layer (LT (Low Temperature)-AlN layer) 5 is formed on the surface of GaN layer 4. AlN layer 5 has a function as an intermediate layer to suppress warpage of the substrate, maintaining crystallinity of GaN. AlN layer 5 is formed by using the MOCVD method, for example. The growth temperature of AlN layer 5 is lower than the film forming temperature of GaN layers 4 and 6 The thickness of AlN layer 5 is preferably larger than 0 and equal to or less than 20 nm. The thickness of AlN layer 5 is more preferably equal to or less than 15 nm.

AlN layer 5 may be an $Al_mGa_{1-m}N$ (0<m≤1, y<m) layer by replacing part of Al atoms with Ga atoms. However, to maintain crystallinity of GaN layer 6, $Al_mGa_{1-m}N$ layer is preferably AlN (in which Al atoms are not replaced with Ga atoms). The value of x may be same as the value of m, and the value of x may be different from the value of m.

GaN layer 6 is formed on the surface of AlN layer 5. GaN layer 6 is doped with Si, and has n-type conductivity. GaN layer 6 is formed in a manner similar to that of GaN layer 4, at the similar film forming temperature. The thickness of GaN layer 6 is preferably more than or equal to 50 nm and equal to or less than 5 μm. The Si dope density of GaN layer 6 may be different from that of GaN layer 4, based on types of the device to be manufactured.

GaN layer 6 may be an $Al_nGa_{1-n}N$ (0≤n<1, n<x, n<m) by replacing part of Ga atoms with Al atoms. However, to maintain crystallinity of GaN layer 6, the $Al_nGa_{1-n}N$ layer is preferably GaN (in which Ga atoms are not replaced with Al atoms). The n-type impurity concentration of GaN layer 6 may be lower than the n-type impurity concentration of GaN layer 4. The n-type impurity concentration of an upper part of GaN layer 6 may be lower than the n-type impurity concentration of the lower part of GaN layer 6. The value of y may be same as the value of n, and the value of y may be different from the value of n.

AlN layer 5 and GaN layer 6 constitute composite layer 7. The number of composite layers formed at the surface side of GaN layer 4 is arbitrary (one layer in this embodiment), and is preferably more than or equal to 1 and equal to or less than 4. When a plurality of composite layers are stacked and formed, electrode 9 is formed at the surface side of GaN layer 6 furthest from SiC layer 2 in the composite layers, The value of m or n of each of layers in the plurality of composite layers may be different from each other.

Electrode 9 is an anode electrode, and is formed on the surface of GaN layer 6. Electrode 9 is placed in schottky contact with GaN layer 6. Electrode 9 is made of Au (gold), for example. Electrode 9 is formed by the deposition method, the MOCVD method, the sputtering method, or the like, for example.

Electrode 10 is a cathode electrode, and formed on the reverse face 1b of Si substrate 1. Electrode 10 is made of Al or the like, for example. Electrode 10 is formed by the deposition method, the MOCVD method, the sputtering method, or the like, for example.

The semiconductor device according to this embodiment works as follows. In a state in which electrode 10 is grounded, when positive electrical potential is applied to electrode 9, electrical current I flows from electrode 9 to electrode 10. Since AlN layers 3 and 5 are thin, electrons can pass through each of AlN layers 3 and 5 by the tunneling effect. The magnitude of electrical current I depends on electrical voltage between electrode 9 and electrode 10.

The semiconductor device according to this embodiment is manufactured in the following manner. The structure (substrate) 8 which includes Si substrate 1 and SiC layer 2 is prepared. AlN layer 3 is formed on the surface of SiC layer 2. The film of GaN layer 4 is formed on the surface of AlN layer 3 at a temperature lower than the film forming temperature of AlN layer 3. AlN layer 5 is formed on the surface of GaN layer 4. The film of GaN layer 6 is formed on the surface of AlN layer 5 at a temperature lower than the film forming temperature of AlN layer 5. Electrode 9 is formed on the surface of GaN layer 6 (at the surface side of AlN layer 3). Electrode 10 is formed at the reverse face 1b of Si substrate 1 (at the reverse face side of AlN layer 3).

The lattice constant of AlN is insignificantly smaller than the lattice constant of GaN. Therefore, when GaN layer 4 is formed on the foundation AlN layer 3 according to this embodiment, since GaN layer 4 is subject to the compression stress, the occurrence of cracks in GaN layer 4 can be avoided. Herewith, GaN layer 4 of the high quality crystal can be obtained, and the electrical resistance of GaN layer 4 can be reduced. On the other hand, AlN layer 3 has high electrical resistance when compared to other layers. According to this embodiment, by forming AlN layer 3 on SiC layer 2, the thickness of AlN layer 3 can be reduced, keeping the high quality of the crystal of GaN layer 4 formed on the surface of AlN layer 3, In consequence, since the electrical resistance between electrode 9 and electrode 10 is reduced, the power consumption of the semiconductor device can be reduced. By forming SiC layer 2 on Si substrate 1, inexpensive and large diameter semiconductor devices can be obtained. Further, by forming SiC layer 2 on Si substrate 1, when AlN layer 3 is thinned, the occurrence of defect by melt back etching caused by the reaction of Ga with Si can be prevented.

[The Second Embodiment]

Figure 2:
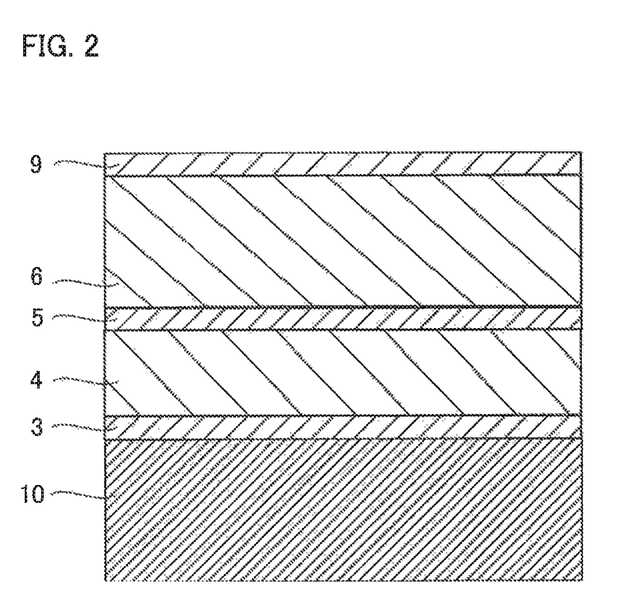
FIG. 2 shows a cross sectional view indicating a structure of the semiconductor device according to the second embodiment of this invention.

FIG. 2 shows a cross sectional view indicating a structure of the semiconductor device according to the second embodiment of this invention.

Referring to FIG. 2, the structure of the semiconductor device according to the embodiment is different from the structure of the semiconductor device according to the first embodiment, in that the Si substrate and the SiC layer are removed. Electrode 10 is formed on the reverse face side of AlN layer 3. Electrode 10 and AlN layer 3 may make directly contact with each other, or electrode 10 and AlN layer 3 may be placed interposing an arbitrary electrical conductor.

Since the structures of the semiconductor device according to the embodiment other than the above mentioned are similar to the structures of the semiconductor device according to the first embodiment, the same numerals are provided for same components, and the explanations are not repeated.

Next, by using FIG. 3 to FIG. 6, the method for manufacturing the semiconductor device according to the embodiment will be explained.

Figure 3:
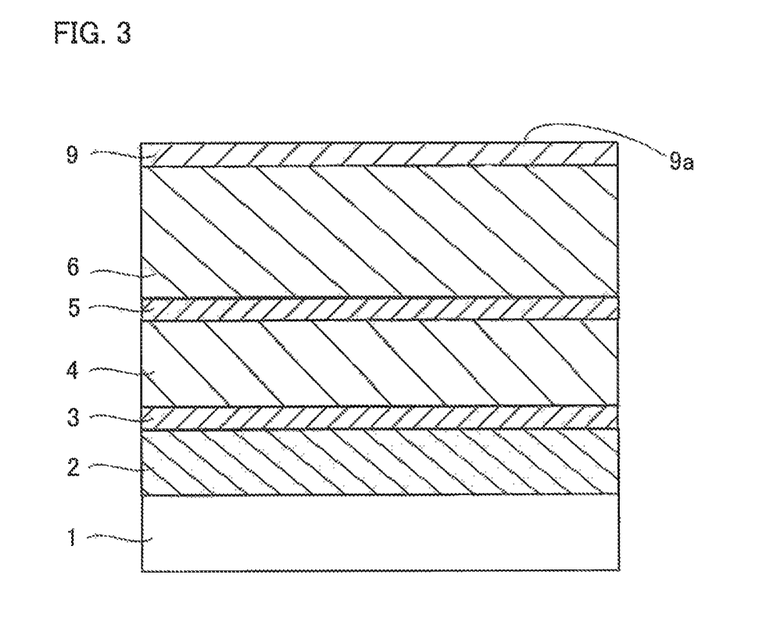
FIG. 3 shows a cross sectional view indicating the first step of the method for manufacturing the semiconductor device according to the second embodiment of this invention.

Referring to FIG. 3, Si substrate 1, SiC layer 2, AlN layer 3, GaN layer 4, AlN layer 5, GaN layer 6, and electrode 9 are formed in a manner similar to the manufacturing method of the first embodiment. When resist is formed on the surface 9a of electrode 9 during patterning electrode 9, the resist is preferably not removed and maintained as a protective film.

Figure 4:
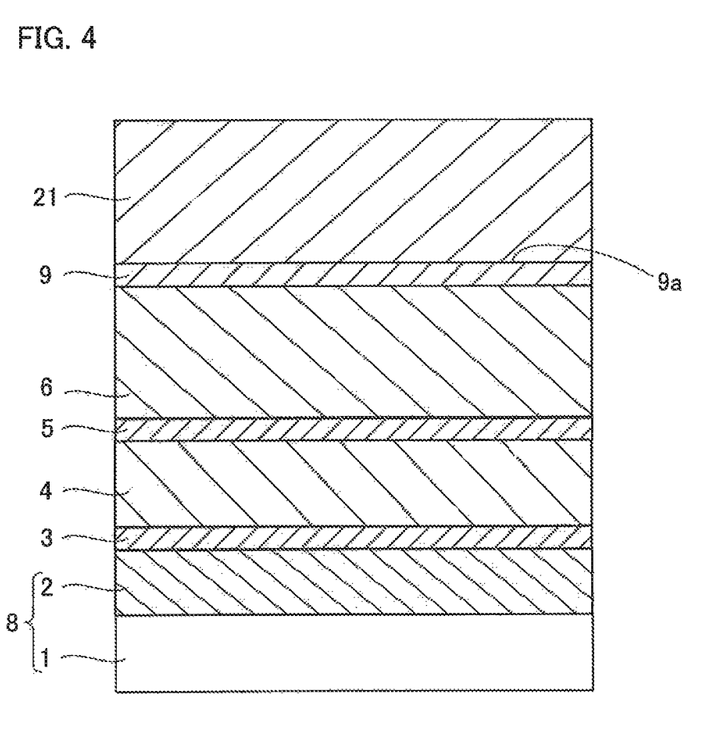
FIG. 4 shows a cross sectional view indicating the second step of the method for manufacturing the semiconductor device according to the second embodiment of this invention.

Referring to FIG. 4, supporting substrate 21 is stuck on the surface 9a of electrode 9, by using an adhesive agent such as electron wax. Supporting substrate 21 comprises of Si, SiC, or the like, for example.

Figure 5:
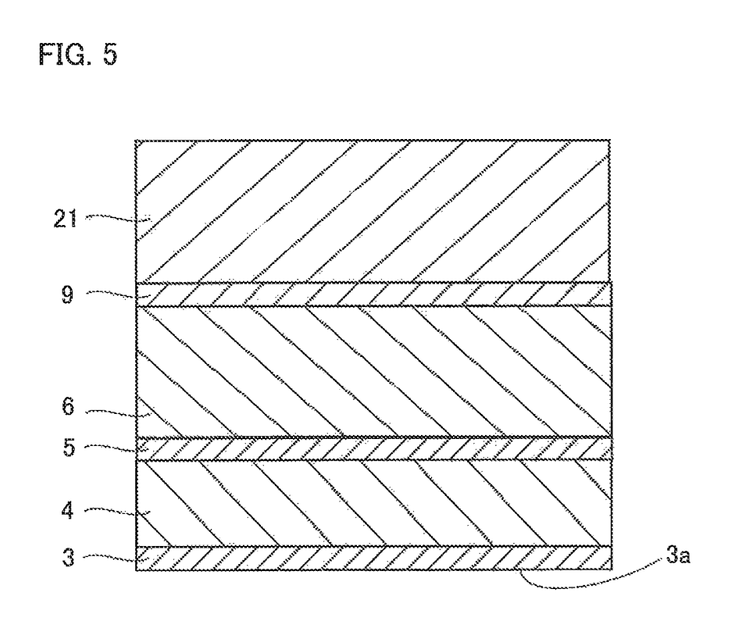
FIG. 5 shows a cross sectional view indicating the third step of the method for manufacturing the semiconductor device according to the second embodiment of this invention.

Referring to FIG. 5, Si substrate 1 is removed by wet etching using hot nitric acid, boiling nitric acid, or the like, for example. Next, SiC layer 2 is removed by dry etching or the like. Herewith, substrate 8 is removed, and reverse face 3a of AlN layer 3 is exposed. SiC layer 2 may be not removed and be maintained. Substrate 8 may be removed, after AlN layer 3 and GaN layer 4 were formed. Further, maintaining the GaN layer farthest from substrate 8 (the GaN layer uppermost in the Figures), all the layers formed at the reverse face side of the maintained GaN layer may be removed.

Figure 6:
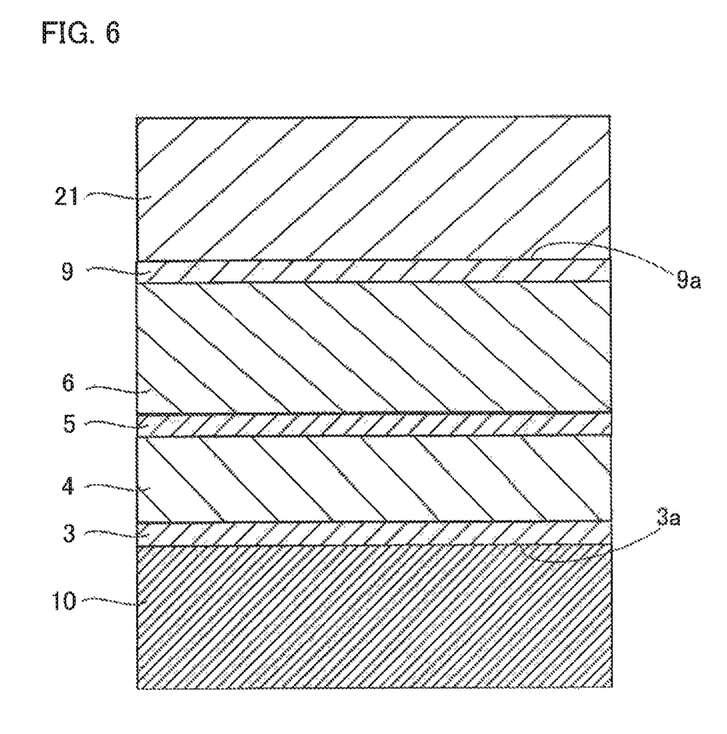
FIG. 6 shows a cross sectional view indicating the fourth step of the method for manufacturing the semiconductor device according to the second embodiment of this invention.

Referring to FIG. 6, electrode 10 is stuck on the reverse face 3a of AlN layer 3 (on the reverse face of SiC layer 2 when the SiC layer was maintained, or on the reverse face of the GaN layer farthest from substrate 8 when all the layers formed at the reverse face side of the GaN layer farthest from substrate 8 were removed), by using an electric conductive adhesive agent such as Ag (silver) paste or the like. Next, supporting substrate 21 is removed by heating, for example. Next, the adhesive agent and the protective film which remain on the surface 9a of electrode 9 are removed by using solvent such as acetone, for example. As described above, the semiconductor device shown in FIG. 2 can be obtained. A substrate of which the electric conductivity is higher than that of substrate 1 can be stuck as electrode 10.

According to this embodiment, the effect similar to the first embodiment can be acquired. in addition, it is possible to reduce the thickness of the semiconductor device and to reduce the electrical resistance in the longitudinal direction, since the thicknesses of the Si substrate and the SiC layer are eliminated from the thickness of the semiconductor device.

[Others]

The thickness of each of layers which constitute the semiconductor device is measured by using a spectroscopic ellipsometer. A spectroscopic ellipsometer irradiates an object to be measured with incident light which is polarized light, and receives the reflected light from the object to be measured. Since there is a difference in phase shift and reflectance between S polarized light and P polarized light, the polarized light state of the reflected light is different from the polarized light state of the incident light. The change of the polarized light state depends on the wavelength of the incident light, the incident angle, the optical constant value of the film, the film thickness, and so on. The spectroscopic ellipsometer calculates the optical constant value and the film thickness of the film from the acquired reflected light, based on the wavelength of the incident light and the incident angle.

In the above mentioned embodiments, an electrical conductor layer may be a layer other than the Si substrate. The electrical conductor layer may be made of metal such as Cu (copper) and Al, or an electric conductive semiconductor layer such as GaAs (gallium arsenide), Ge(germanium), and Si, for example.

In each of the above mentioned embodiments, AlN layer 5 and GaN layer 6 may be omitted, and electrode 9 may be directly formed on the surface of GaN layer 4. In this case, the manufacturing process can be simplified, and the semiconductor device can have a simple structure. At the surface side of GaN layer 6, an AlN layer and a GaN layer may be further stacked. In this case, the quality of the crystal of the GaN layer can be improved.

The device formed on the semiconductor device may be an arbitrary upright device. It may be a MOSFET, an LED (Light Emitting Diode), a thyristor, a semiconductor laser, or the like, other than the above described schottky barrier diode. The semiconductor device may be any device as long as the magnitude of electrical current which flows between the first electrode formed at the surface side of $Al_yGa_{1-y}N$ layer and the second electrode formed at the reverse face side of the Si substrate depends on the electrical voltage between the first electrode and the second electrode.

Although the present invention has been described and illustrated in detail, it is clearly understood that the same is by way of illustration and example only and is not to be taken by way of limitation, the spirit and scope of the present invention being limited only by the terms of the appended claims.

THE EXPLANATION OF THE REFERENTIAL NUMERALS

1 Si (silicon) substrate
1a The surface of the Si substrate
1b The reverse face of the Si substrate
2 SiC (silicon carbide) layer
3, 5 AlN (aluminum nitride) layers 3a The reverse face of the AlN layer
4, 6 GaN (gallium nitride) layer
7a, 7b Composite layers
8 The structure (substrate) which includes the Si substrate and the SiC layer
9, 10 Electrodes
9a The surface of the electrode
21 Supporting substrate
I Electrical current

What is claimed is:

1. A semiconductor device comprising:
    an electrical conductor layer,
    an SiC layer formed on a surface of the electrical conductor layer,
    an AlN layer formed on a surface of the SiC layer, a thickness of the AlN layer is larger than 0 and equal to or less than 15 nm,
    an $Al_yGa_{1-y}N$ ($0 \leq y < 1$) layer of a first conductivity type, formed on a surface of the AlN layer,
    a composite layer formed on a surface of the $Al_yGa_{1-y}N$ layer,
    a first electrode formed at a surface side of the $Al_yGa_{1-y}N$ layer, and
    a second electrode formed on a reverse face side of the electrical conductor layer, wherein
    magnitude of electrical current which flows between the first electrode and the second electrode depends on electrical voltage between the first electrode and the second electrode,
    the composite layer includes an $Al_mGa_{1-m}N$ ($0 < m \leq 1$, $y < m$) layer, and an $Al_nGa_{1-n}N$ ($0 \leq n < 1$, $n < m$) layer formed on a surface of the $Al_mGa_{1-m}N$ layer,
    a distance between the first electrode and the electrical conductor layer is larger than a distance between the $Al_nGa_{1-n}N$ layer and the electrical conductor layer,
    each of the $Al_yGa_{1-y}N$ layer and the $Al_nGa_{1-n}N$ layer has n-type conductivity, and each of the $Al_yGa_{1-y}N$ layer and the $Al_nGa_{1-n}N$ layer is doped with Si, and
    a Si dope density of the $Al_nGa_{1-n}N$ layer is different from a Si dope density of the $Al_yGa_{1-y}N$ layer.

2. The semiconductor device according to claim 1, wherein
    thickness of each of the $Al_yGa_{1-y}N$ layer and the $Al_nGa_{1-n}N$ layer is more than or equal to 50 nm and equal to or less than 5 μm.

3. The semiconductor device according to claim 1, wherein
    thickness of the $Al_mGa_{1-m}N$ layer is more than 0 and equal to or less than 15 nm.

4. The semiconductor device according to claim 1, wherein
    the composite layer comprises more than or equal to 1 and equal to or less than 4 layers.

5. The semiconductor device according to claim 1, wherein
    the electrical conductor layer is a Si substrate.

6. A method for manufacturing a semiconductor device comprising:
    a step for preparing a substrate which includes an electrical conductor layer and an SiC layer formed on a surface of the electrical conductor layer,
    a step for forming a film of an AlN layer on a surface of the SiC layer, a thickness of the AlN layer is larger than 0 and equal to or less than 15 nm,
    a step for forming a film of $Al_yGa_{1-y}N$ layer ($0 \leq y < 1$) of a first conductivity type on a surface of the AlN layer,
    a step for forming a film of $Al_mGa_{1-m}N$ ($0 < m \leq 1$, $y < m$) layer on a surface of the $Al_yGa_{1-y}N$ layer at a temperature lower than a film forming temperature of the $Al_yGa_{1-y}N$ layer,
    a step for forming a film of $Al_nGa_{1-n}N$ layer ($0 \leq n < 1$, $n < m$) layer on a surface of the $Al_mGa_{1-m}N$ layer at a temperature higher than a film forming temperature of the $Al_mGa_{1-m}N$ layer,
    a step for forming a first electrode at a surface side of the $Al_nGa_{1-n}N$ layer, and
    a step for forming a second electrode at a reverse face side of the $Al_nGa_{1-n}N$ layer, wherein
    magnitude of electrical current which flows between the first electrode and the second electrode depends on electrical voltage between the first electrode and the second electrode,
    the formed film of the $Al_yGa_{1-y}N$ layer is doped with Si, in the step for forming a film of the $Al_yGa_{1-y}N$ layer,
    the formed film of the $Al_nGa_{1-n}N$ layer is doped with Si, in the step for forming a film of the $Al_nGa_{1-n}N$ layer,
    each of the $Al_yGa_{1-y}N$ layer and the $Al_nGa_{1-n}N$ layer has n-type conductivity, and
    a Si dope density of the $Al_nGa_{1-n}N$ layer is different from a Si dope density of the $Al_yGa_{1-y}N$ layer.

7. The method for manufacturing a semiconductor device according to claim 6, further comprising
    a step for removing the electrical conductor layer after films of the AlN layer, the $Al_yGa_{1-y}N$ layer, the $Al_mGa_{1-m}N$ layer, and the $Al_nGa_{1-n}N$ layer were formed, wherein
    the second electrode is formed at a reverse face side of the $Al_nGa_{1-n}N$ layer, in the step for forming the second electrode, after the electrical conductor layer was removed.

8. The method for manufacturing a semiconductor device according to claim 7, wherein
    the substrate is removed in the step for removing the electrical conductor layer.

9. The method for manufacturing a semiconductor device according to claim 8, wherein
    all layers formed at a reverse face side of the $Al_nGa_{1-n}N$ layer are removed, maintaining the $Al_nGa_{1-n}N$ layer farthest from the substrate, in the step for removing the electrical conductor layer.

* * * * *

UNITED STATES PATENT AND TRADEMARK OFFICE
CERTIFICATE OF CORRECTION

PATENT NO. : 10,186,585 B2
APPLICATION NO. : 15/521697
DATED : January 22, 2019
INVENTOR(S) : Akira Fukazawa et al.

It is certified that error appears in the above-identified patent and that said Letters Patent is hereby corrected as shown below:

In the Claims

Claim 6 should read:
6. A method for manufacturing a semiconductor device comprising:
a step for preparing a substrate which includes an electrical conductor layer and
   an SiC layer formed on a surface of the electrical conductor layer,
a step for forming a film of an AlN layer on a surface of the SiC layer, a
   thickness of the AlN layer is larger than 0 and equal to or less than 15nm,
a step for forming a film of $Al_yGa_{1-y}N$ layer ($0 \leq y < 1$) of a first conductivity
   type on a surface of the AlN layer,
a step for forming a film of $Al_mGa_{1-m}N$ ($0 < m \leq 1$, $y < m$) layer on a surface of
   the $Al_yGa_{1-y}N$ layer at a temperature lower than a film forming temperature of
   the $Al_yGa_{1-y}N$ layer,
a step for forming a film of $Al_nGa_{1-n}N$ layer ($0 \leq n < 1$, $n < m$) layer on a surface
   of the $Al_mGa_{1-m}N$ layer at a temperature higher than a film forming temperature
   of the $Al_mGa_{1-m}N$ layer,
a step for forming a first electrode at a surface side of the $Al_nGa_{1-n}N$ layer, and
a step for forming a second electrode at a reverse face side of the $Al_nGa_{1-n}N$
   layer, wherein
magnitude of electrical current which flows between the first electrode and
   the second electrode depends on electrical voltage between the first
   electrode and the second electrode,
the formed film of the $Al_yGa_{1-y}N$ layer is doped with Si, in the step for forming
   a film of the $Al_yGa_{1-y}N$ layer,
the formed film of the $Al_nGa_{1-n}N$ layer is doped with Si, in the step for forming
   a film of the $Al_nGa_{1-n}N$ layer,
each of the $Al_yGa_{1-y}N$ layer and the $Al_nGa_{1-n}N$ layer has n-type conductivity, and
a Si dope density of the $Al_nGa_{1-n}N$ layer is different from a Si dope density of
   the $Al_yGa_{1-y}N$ layer.

Signed and Sealed this
Seventh Day of May, 2019

Andrei Iancu
*Director of the United States Patent and Trademark Office*